(12) United States Patent
Zhang et al.

(10) Patent No.: US 10,923,537 B2
(45) Date of Patent: Feb. 16, 2021

(54) DISPLAY SCREENS AND DISPLAY DEVICES

(71) Applicant: Kunshan Go-Visionox Opto-Electronics Co., Ltd., Kunshan (CN)

(72) Inventors: Tingting Zhang, Kunshan (CN); Lu Zhang, Kunshan (CN); Zhenzhen Han, Kunshan (CN); Siming Hu, Kunshan (CN)

( * ) Notice: Subject to any disclaimer, the term of this patent is extended or adjusted under 35 U.S.C. 154(b) by 0 days.

(21) Appl. No.: 16/596,775

(22) Filed: Oct. 9, 2019

(65) Prior Publication Data

US 2020/0043988 A1 Feb. 6, 2020

Related U.S. Application Data

(63) Continuation of application No. PCT/CN2018/089088, filed on May 30, 2018.

(30) Foreign Application Priority Data

Oct. 31, 2017 (CN) .......................... 201711048708.4

(51) Int. Cl.
*H01L 27/32* (2006.01)
*G09G 3/3225* (2016.01)

(52) U.S. Cl.
CPC ....... *H01L 27/3218* (2013.01); *G09G 3/3225* (2013.01); *G09G 2330/00* (2013.01)

(58) Field of Classification Search
CPC ............ H01L 27/3218; H01L 27/3216; G09G 3/3225; G09G 2330/00; G09G 2300/0443;

(Continued)

(56) References Cited

U.S. PATENT DOCUMENTS

| 8,598,784 | B2 | 12/2013 | Ko |
| 9,433,058 | B2 | 8/2016 | Wu et al. |

(Continued)

FOREIGN PATENT DOCUMENTS

| CN | 1614659 A | 5/2005 |
| CN | 101153931 A | 4/2008 |

(Continued)

OTHER PUBLICATIONS

International Search Report dated Sep. 5, 2018 in the corresponding international application (application No. PCT/CN2018/089088).

(Continued)

*Primary Examiner* — Andrew Sasinowski
(74) *Attorney, Agent, or Firm* — Kilpatrick Townsend & Stockton

(57) ABSTRACT

A display screen having an irregular shape and a display device are provided. The display screen has a contour line defining an active display area. The display screen includes a plurality of repeatedly arranged first light emitting units and a plurality of repeatedly arranged second light emitting units. The number of sub-pixels in the first light emitting units is greater than or equal to the number of sub-pixels in the second light emitting units. The first light emitting units and the second light emitting units with different structures are combined and filled with the contour line of the display screen to define the active display area, and the contour line is fit by different shapes of the first light emitting units and the second light emitting units.

20 Claims, 3 Drawing Sheets

(58) Field of Classification Search
CPC ... G09G 2300/0439; G09G 2300/0452; G09G 2300/08; G09G 2300/0426; G09G 3/20; G02F 1/1333; G09F 9/30; G09F 9/302
See application file for complete search history.

(56) References Cited

U.S. PATENT DOCUMENTS

| | | | |
|---|---|---|---|
| 2010/0214195 A1* | 8/2010 | Ogasawara | G02F 1/136286 345/55 |
| 2010/0289994 A1 | 11/2010 | Nonaka | |
| 2014/0071030 A1 | 3/2014 | Lee | |
| 2015/0016103 A1 | 1/2015 | Peng | |
| 2016/0078807 A1* | 3/2016 | Sun | G09G 3/3233 345/204 |
| 2017/0097535 A1 | 4/2017 | Andou et al. | |
| 2017/0192313 A1 | 7/2017 | Long et al. | |
| 2018/0075797 A1* | 3/2018 | Park | G09G 3/2092 |
| 2018/0151612 A1* | 5/2018 | Zheng | G09G 3/20 |
| 2018/0204532 A1* | 7/2018 | Kobayashi | G02B 27/017 |
| 2018/0239194 A1* | 8/2018 | Tan | G02B 5/1871 |
| 2018/0374435 A1* | 12/2018 | Chen | G09G 3/3611 |

FOREIGN PATENT DOCUMENTS

| | | |
|---|---|---|
| CN | 101849255 A | 9/2010 |
| CN | 101887189 A | 11/2010 |
| CN | 102116939 A | 7/2011 |
| CN | 102855820 A | 1/2013 |
| CN | 104637987 A | 5/2015 |
| CN | 105514134 A | 4/2016 |
| CN | 205281989 U | 6/2016 |
| CN | 205318767 U | 6/2016 |
| CN | 106340249 A | 1/2017 |
| CN | 106530993 A | 3/2017 |
| CN | 106783937 A | 5/2017 |
| CN | 107067974 A | 8/2017 |
| CN | 107229154 A | 10/2017 |
| JP | 2015018239 A | 1/2015 |
| TW | 201616192 A | 5/2016 |
| WO | 2009057342 A1 | 5/2009 |
| WO | 2015180369 A1 | 12/2015 |

OTHER PUBLICATIONS

CN First Office Action with search report dated Aug. 22, 2019 in the corresponding CN application(application No. 201711048708.4).
TW First Office Action with search report dated Jan. 31, 2019 in the corresponding TW application (application No. 107122426).
TW Second Office Action dated Jun. 21, 2019 in the corresponding TW application (application No. 107122426).
Office Action of Japanese Application No. 2019-568405.

* cited by examiner

DISPLAY SCREENS AND DISPLAY DEVICES

CROSS-REFERENCES TO RELATED APPLICATIONS

This application is a continuation application of International Application PCT/CN2018/089088, filed on May 30, 2018, which claims the benefit of Chinese Patent Application No. 201711048708.4, entitled "DISPLAY SCREEN WITH IRREGULAR SHAPE AND DISPLAY DEVICE", filed on Oct. 31, 2017. Both applications are incorporated by reference herein in their entireties.

TECHNICAL FIELD

The present disclosure relates to the field of display.

BACKGROUND

A conventional display screen includes pixel units composed of at least a green sub-pixel, a blue sub-pixel, and a red sub-pixel. A plurality of pixel units can constitute a pixel array for presenting a picture. With the development of diversified applications of display screens, the shape of the display screen needs to be adapted to the specific application. That is to say, it is necessary to design a "display screen with irregular shape" different from a conventional square shaped screen, such as a spherical screen, a polyhedral screen, or the like.

SUMMARY

According to various embodiments of present disclosure, a display screen having an irregular shape is provided. The display screen has a contour line defining an active display area, and includes a plurality of repeatedly arranged first light emitting units having a plurality of sub-pixels, and a plurality of repeatedly arranged second light emitting units having a plurality of sub-pixels. The number of the sub-pixels in the first light emitting units is greater than or equal to the number of the sub-pixels in the second light emitting units.

In one of the embodiments, the first light emitting units are continuously arranged and form a main display area in the active display area, and at least one second light emitting unit is independently distributed and forms an edge display area in the active display area.

In one of the embodiments, a normal distance from a center of the second light emitting unit to the contour line does not exceed a preset distance threshold.

In one of the embodiments, the first light emitting unit includes two first sub-pixels, two second sub-pixels, and two third sub-pixels.

In one of the embodiments, the second light emitting unit includes a first sub-pixel, a second sub-pixel, and a third sub-pixel.

In one of the embodiments, the first sub-pixel, the second sub-pixel, and the third sub-pixel in the second light emitting unit are arranged in a triangle or arranged along a straight line.

In one of the embodiments, the triangle is an acute triangle or a right triangle.

In one of the embodiments, the second light emitting unit includes one of the following: two first sub-pixels, two second sub-pixels, and a third sub-pixel; two first sub-pixels, a second sub-pixel, and a third sub-pixel; two sub-pixels from a first sub-pixel, a second sub-pixel, and a third sub-pixel; and one sub-pixel from a first sub-pixel, a second sub-pixel, and a third sub-pixel.

In one of the embodiments, the first light emitting unit includes one of the following: two first sub-pixels, two second sub-pixels, and a third sub-pixel; two first sub-pixels, a second sub-pixel, and a third sub-pixel; and a first sub-pixel, a second sub-pixel, and a third sub-pixel.

In one of the embodiments, when the number of the sub-pixels in the first light emitting units is equal to the number of the sub-pixels in the second light emitting units, the first light emitting units and the second light emitting units are continuously arranged along a first direction, respectively, and the first light emitting units and the second light emitting units are alternately arranged along a second direction intersecting the first direction.

In one of the embodiments, an arrangement pattern of the sub-pixels in the second light emitting units and an arrangement pattern of the sub-pixels in the first light emitting units are mirror symmetrical in the first direction.

In one of the embodiments, a light emitting area of one of the first sub-pixels, the second sub-pixels, and the third sub-pixels is different from light emitting areas of the other two sub-pixels.

In one of the embodiments, a radius of curvature of a surface where the first light emitting units are located is greater than a radius of curvature of a surface where the second light emitting units are located.

The present disclosure also provide a display screen having an irregular shape and having a contour line defining an active display area and including a plurality of repeatedly arranged first light emitting units and a plurality of repeatedly arranged second light emitting units, a radius of curvature of a surface where the first light emitting units are located is greater than a radius of curvature of a surface where the second light emitting units are located.

In one of the embodiments, the first light emitting units are continuously arranged and form a main display area in the active display area, and at least one second light emitting unit is independently distributed and forms an edge display area in the active display area.

According to various embodiments of present disclosure, a display device is provided including a display screen having an irregular shape and having a contour line defining an active display area. The display screen includes a plurality of repeatedly arranged first light emitting units and a plurality of repeatedly arranged second light emitting units. The number of sub-pixels in the first light emitting units is greater than or equal to the number of sub-pixels in the second light emitting units, or a radius of curvature of a surface where the first light emitting units are located is greater than a radius of curvature of a surface where the second light emitting units are located; a power module supplying power to the display screen; a storage module storing media information; and a processing module electrically coupled to the display screen, the power module, and the storage module. The processing module controls the power supplied by the power module, and displays the media information on the display screen.

In one of the embodiments, when the number of the sub-pixels in the first light emitting units is equal to the number of the sub-pixels in the second light emitting units, the first light emitting units and the second light emitting units are continuously arranged along a first direction, respectively, and the first light emitting units and the second light emitting units are alternately arranged along a second direction intersecting the first direction.

The first light emitting units and the second light emitting units of different structures are combined with each other and filled with the display screen. The different structures may be different in the number of sub-pixels, or may be different in the radius of curvature of flat sizes of the light emitting units, or be mirrored structures, or the like. By providing the first light emitting units and the second light emitting units with different structures on the main display area and the edge display area in the active display area, the obvious jaggedness or graininess of the edge display area when observed under a microscopic scale is reduced, such that the display quality of the display screen is improved.

DETAILED DESCRIPTION OF THE INVENTION

In the process of implementing the display devices, the applicants found the following technical problems:

The pixel unit has a certain spatial size, or that is to say, the pixel unit can be regarded as a point or a particle having a certain radial dimension on the microstructure, and the contour line of the display screen is a flat smooth curve or a spatial smooth curve, and when is it observed under a microscopic scale, the pixel units distributed along the contour line of the display screen will obviously be jagged or grainy, so as to perform a poor display quality.

The technical solutions of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

The display screen is a display screen having an irregular shape that is evolved from a conventional display screen. The shape of the display screen is different from the square or plate shape of a conventional display screen. The spatial structure of the display screen is substantially a portion cut from a sphere, or a portion cut from a cylinder, or a portion cut from a cuboid. The display surface of the display screen is a three-dimensional spatial curved surface corresponding to the sphere or the cylinder, or a two-dimensional plane at least having a part of curved contour.

Figure 1:
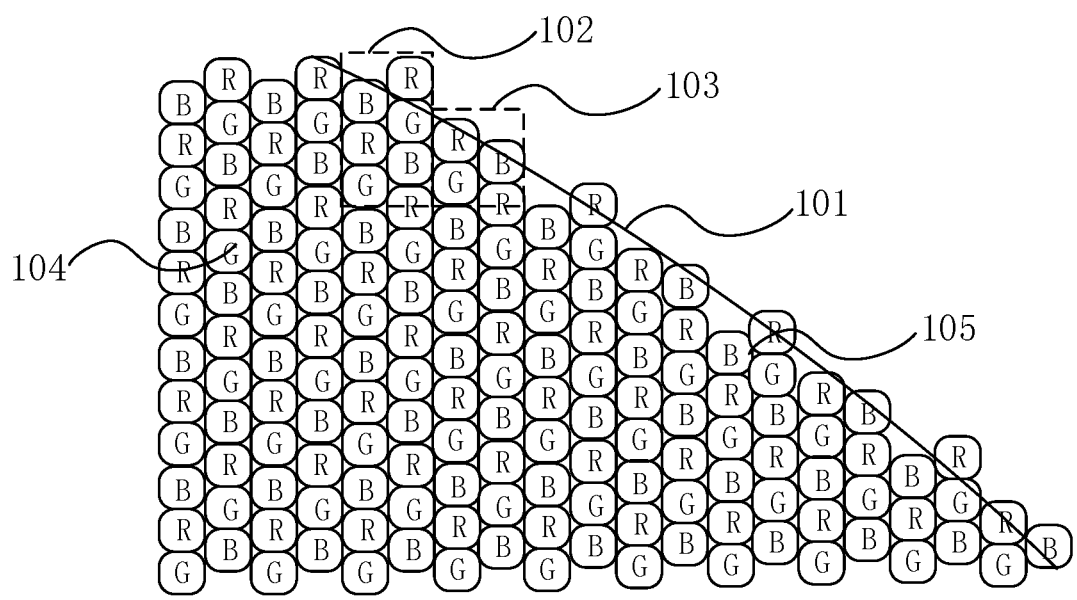
FIG. 1 is a partial detail view of a display screen according to an embodiment of the present disclosure.

FIG. 1 is a partial detail view of a display screen according to an embodiment of the present disclosure.

The display screen has a contour line 101 to define an active display area. The active display area can be used to present pictures or dynamic display images. When the active display area is provided with a touch sensor, the operator's motion can also be sensed and responded. In specific applications, the display screen can be a curved surface screen of a television or a mobile phone.

The display screen includes a plurality of repeatedly arranged first light emitting units 101 and a plurality of repeatedly arranged second light emitting units 103.

The number of the sub-pixels in the first light emitting units 102 is greater than the number of the sub-pixels in the second light emitting units 103.

The first light emitting units are continuously arranged and form a main display area in the active display area.

At least one of the second light emitting units is independently distributed and forms an edge display area in the active display area.

The first light emitting unit 102 includes at least one pixel unit. The second light emitting unit 103 includes at least one sub-pixel.

Hereinafter, an example that the first light emitting unit 102 includes two pixel units, and the second light emitting unit 103 includes one pixel unit is described in details. One of the pixel units includes a red sub-pixel, a green sub-pixel, and a blue sub-pixel. As shown in FIG. 1, the first light emitting unit 102 includes two first sub-pixels, two second sub-pixels, and two third sub-pixels.

The first sub-pixel, the second sub-pixel, and the third sub-pixel can emit light of different colors, respectively. The first sub-pixel, the second sub-pixel, and the third sub-pixel can emit light of any one color of red (R), green (G), and blue (B), however, the first sub-pixel, the second sub-pixels and the third sub-pixel cannot emit light of the same color. The color displayed by the first light emitting unit 102 depends on the types of the first sub-pixel, the second sub-pixel, and the third sub-pixel that it includes.

Structurally, any two of the three types of sub-pixels can be combined and arranged to form six different forms of the first light emitting unit 102. In the illustrated embodiment, one of the forms can be selected. In the illustrated embodiment, the selected arrangement form of the first light emitting unit 102 is B-R/R-G/G-B. In the lateral direction (the left-right direction in FIG. 1), a line connecting a center of the blue sub-pixel and a center of the red sub-pixel of the first row is inclined relative to the horizontal line. A line connecting a center of the red sub-pixel and a center of the green sub-pixel of the second row is parallel to the line connecting the center of the blue sub-pixel and the center of the red sub-pixel of the first row. A line connecting a center of the green sub-pixel and a center of the blue sub-pixel of the third row is parallel to the line connecting the center of the blue sub-pixel and the center of the red sub-pixel of the first row. In the vertical direction (up and down direction in FIG. 1), centers of the B-R-G sub-pixels of the first column are in the same straight line, and centers of the R-G-B sub-pixels of the second column are also in the same straight line. The first light emitting unit 102 employing this structure is easy to fit the shape of the contour line 101 of the display screen.

The sub-pixels of the first light emitting unit 102 may be arranged in other forms, for example, two first sub-pixels, two second sub-pixels, and two third sub-pixels may be arranged in two rows and three columns, or in three rows and two columns. The arrangement form of the sub-pixels of the first light emitting unit 102 is not limited to the above forms, as long as the color display requirement of the display screen is satisfied. The second light emitting unit 103 includes a first sub-pixel, a second sub-pixel, and a third sub-pixel.

The first sub-pixel, second sub-pixel, and third sub-pixel can also emit light of different colors, for example, three colors of red (R), green (G), and blue (B) can be emitted, respectively. The colors of the light emitted by the three sub-pixels are different from each other. The principle of color development of the second light emitting unit 103 composed of the three sub-pixels is the same as that of the first light emitting unit 102, and details are not described herein again.

Structurally, the first sub-pixel, the second sub-pixel, and the third sub-pixel belonging to the second light emitting unit 103 are arranged in a triangle. The second light emitting units 103 and the first light emitting units 102 are combined with each other to fit the contour line 101 of the display screen.

The first sub-pixel, the second sub-pixel, and the third sub-pixel of the second light emitting unit 103 may have other arrangement forms, for example, centers of the first sub-pixel, the second sub-pixel, and the third sub-pixel are arranged along the same straight line. The arrangement form of the sub-pixels is not limited to the above forms, as long as the color display requirement of the display screen is satisfied.

Figure 3:
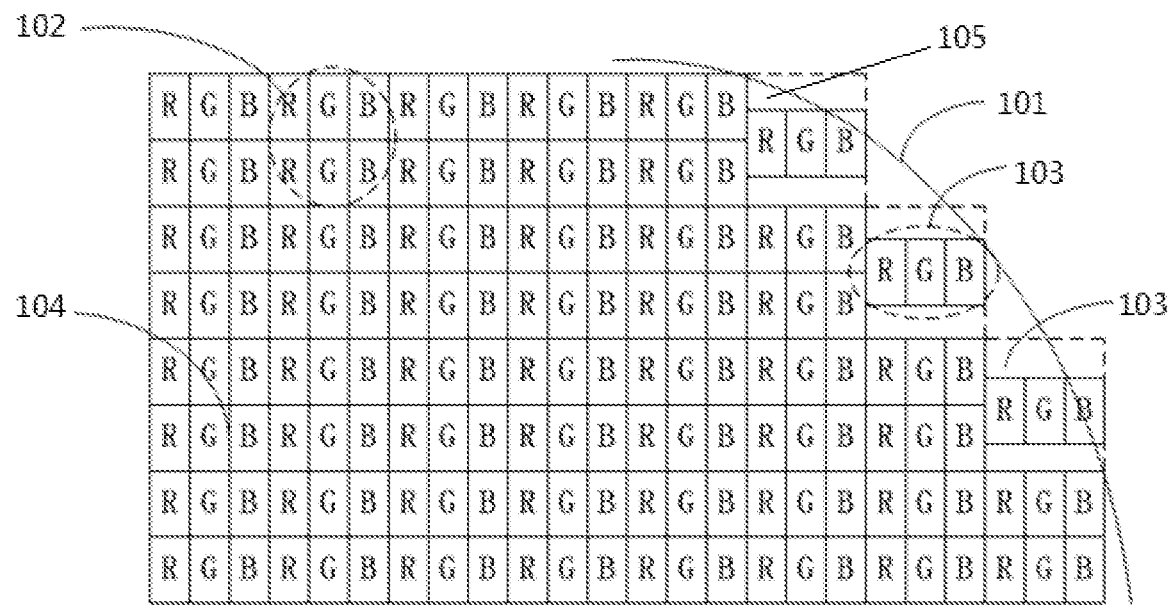
FIG. 3 is a partial detail view of yet another display screen with an irregular shape according to an embodiment of the present disclosure.

As shown in FIG. 3, the first light emitting unit 102 is composed of two pixel units with standard RGB arrangement. Specifically, in FIG. 3, the first row is a pixel unit composed of a red (R) sub-pixel, a green (G) sub-pixel, and a blue (B) sub-pixel, and the second row is also a pixel unit composed of a red (R) sub-pixel, a green (G) sub-pixel, and a blue (B) sub-pixel, the two pixel units are stacked in the column direction (up and down direction in FIG. 3). Along the column direction, the red (R) sub-pixels form a column, the green (G) sub-pixels form a column, and the blue (B) sub-pixels form a column. It should be noted that, the columns can also be changed to rows.

The second light emitting unit 103 is composed of a red (R) sub-pixel, a green (G) sub-pixel, and a blue (B) sub-pixel arranged in a row. That is to say, the first sub-pixel is the red (R) sub-pixel, the second sub-pixel is the green (G) sub-pixel, and the third sub-pixel is the blue (B) sub-pixel. Of course, the order of arrangement of the first sub-pixel, the second sub-pixel, and the third pixel herein may be adjusted according to a specific situation.

The sub-pixels of the second light emitting unit 103 can be other numbers, as long as the number of sub-pixels of the second light emitting unit 103 is less than the number of sub-pixels of the first light emitting unit 102. Specifically, when the first light emitting unit 102 includes two first sub-pixels, two second sub-pixels, and two third sub-pixels, the second light emitting unit may be two first sub-pixels, two second sub-pixels, and a third sub-pixel, or may be two first sub-pixels, a second sub-pixel, and a third sub-pixel, or may be a first sub-pixel, a second sub-pixel, and a third sub-pixel, or may be any two sub-pixels from a first sub-pixel, a second sub-pixel, and a third sub-pixel, or any one sub-pixel from a first sub-pixel, a second sub-pixel, and a third sub-pixel.

Correspondingly, when the number of sub-pixels included in the first light emitting unit 102 is reduced, the number of sub-pixels included in the second light emitting units 103 may be correspondingly reduced. For example, the first light emitting unit 102 can include one of the following:

two first sub-pixels, two second sub-pixels, and a third sub-pixel;

two first sub-pixels, a second sub-pixel, and a third sub-pixel; or a first sub-pixel, a second sub-pixel, and a third sub-pixel.

The first sub-pixel herein is a red (R) sub-pixel, the second sub-pixel is a green (G) sub-pixel, and the third sub-pixel is a blue (B) sub-pixel. However, it is only taken as an example, at least one of the first sub-pixel, second sub-pixel, and third sub-pixel can be a color other than the three primary colors of red, green, and blue.

According to another embodiment of the present disclosure, a display screen with an irregular shape is provided. The display screen has a contour line to define an active display area.

The display screen includes a plurality of repeatedly arranged first light emitting units and a plurality of repeatedly arranged second light emitting units.

A radius of curvature of a surface where the first light emitting units are located is greater than a radius of curvature of a surface where the second light emitting units are located.

The first light emitting units are continuously arranged and form a main display area in the active display area.

At least one second light emitting unit is independently distributed and forms an edge display area in the active display area.

Since the radius of curvature of a surface where the first light emitting units are located on the main display area is greater than the radius of curvature of a surface where the second light emitting units are located on the edge display area, the brightness of the edge display area is lower than that of the main display area. Therefore, the obvious jaggedness or graininess of the edge display area when observed under the microscopic scale is reduced, such that the display quality of the display screen is improved.

Additionally, in the embodiments of the present disclosure, the first light emitting units 102 are regularly and repeatedly arranged and form a main display area 104 in the active display area. The second light emitting units 103 are independently distribute and form an edge display 105 area in the active display area.

The second light emitting unit 103 of the edge display region 105 satisfies the following conditions: the normal distance (i.e., the shortest distance) from a center of the second light emitting unit 103 to the contour line 101 does not exceed a preset distance threshold. The preset distance threshold may be set based on statistical data, so as to determine whether a light emitting unit is located in the edge display area 105. For example, according to the statistical data, it is found that for a light emitting unit of a specific size, if the main display area 104 is reached by shifting 3 mm inward from the contour line 101, then the 3 mm can be set as the preset distance threshold. Of course, the preset distance threshold value of 3 mm herein is only an example, and the range of the specific preset distance threshold is related to the curvature of the contour line 101 and the size of the light emitting unit.

The number of sub-pixels of the second light emitting unit 103 is less than the number of sub-pixels of the first light emitting unit 102, thus the light emitting area of the second light emitting unit 103 is less than the light emitting area of the first light emitting unit 102. Since the second light emitting unit 103 is located in the edge display area 105 adjacent to the contour line 101 of the display screen, and the first light emitting units 102 and the second light emitting units 103 with different shapes are combined and arranged with each other in a manner of fitting the contour line 101 of the display screen, the jaggedness displayed when viewed in microscopic dimensions can be reduced.

The number of the sub-pixels in the first light emitting units is greater than the number of the sub-pixels in the second light emitting units. The first light emitting unit 102 herein is two red (R) sub-pixels, two green (G) sub-pixels, and two blue (B) sub-pixels. In the first light emitting unit 102 herein, a certain sub-pixel may be shared, as long as the number of the sub-pixels in the first light emitting units is greater than the number of the sub-pixels in the second light emitting units. For example, the first light emitting unit 102 includes a red (R) sub-pixel, two green (G) sub-pixels, and two blue (B) sub-pixels, and the red (R) sub-pixel is shared. The first light emitting unit 102 can also include a red (R) sub-pixel, a green (G) sub-pixel, and two blue (B) sub-pixels, and the red (R) sub-pixel and the green (G) sub-pixel are shared.

Figure 2:
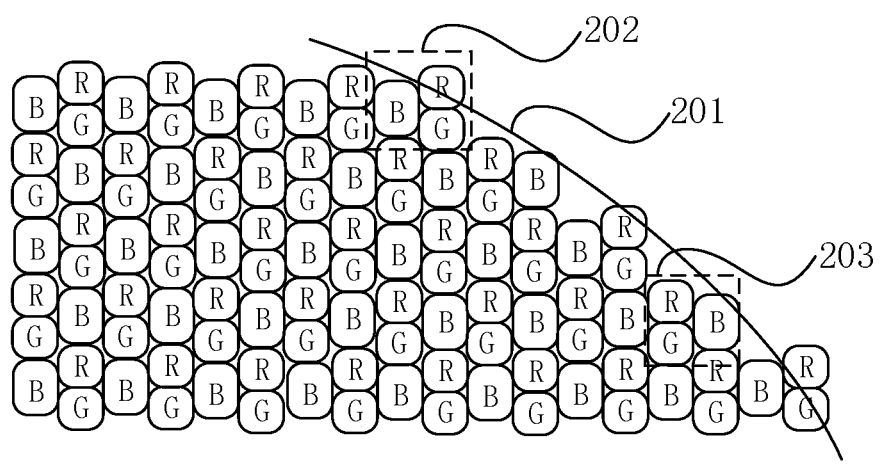
FIG. 2 is a partial detail view of another display screen according to an embodiment of the present disclosure.

FIG. 2 is a partial detail view of a display screen with an irregular shape according to another embodiment of the present disclosure.

The display screen has a contour line 201 to define active display area. The function of the active display area is similar to that in the embodiment described with reference to FIG. 1, and details are not described herein again.

The display screen includes a plurality of repeatedly arranged first light emitting units 202 and a plurality of repeatedly arranged second light emitting units 203.

The number of the sub-pixels in the first light emitting units is equal to the number of the sub-pixels in the second light emitting units.

The first light emitting units and the second light emitting units are continuously arranged along a first direction (the left-right direction in FIG. 2), respectively.

The first light emitting units and the second light emitting units are alternately arranged along a second direction (the up and down direction in FIG. 2).

The first light emitting unit 202 includes a first sub-pixel, a second sub-pixel, and a third sub-pixel. The three sub-pixels can emit light of different colors, respectively. In the illustrated embodiment, the three sub-pixels can emit light of red (R), green (G), and blue (B).

The three sub-pixels of the first light emitting unit 202 are arranged in a triangle. When the three sub-pixels are uniformly emitting light in equal amounts, the first light emitting unit 202 reaches a white balance.

Additionally, in another embodiment of the present disclosure, the triangle is an acute triangle or a right triangle.

For the acute triangle, the distance between sub-pixels of two adjacent rows or columns is half the size of the sub-pixels, which can approximate the contour line of the display screen at the most extent, so as to reduce the jaggedness and graininess of the display screen.

For the right triangle, when stacking sub-pixels, the sub-pixels can be stacked with the right-angled edges, so as to provide convenience.

Additionally, a light emitting area of one of the first sub-pixel, the second sub-pixel, and the third sub-pixel is different from light emitting areas of the other two sub-pixels. For example, if the first sub-pixel is a red sub-pixel, the second sub-pixel is a green sub-pixel, and the third sub-pixel is a blue sub-pixel, since the blue-light material has a low luminous efficiency, the light emitting area of the third sub-pixels can be set to be larger than the light emitting area of the first sub-pixel or the second sub-pixel. Of course, it is only an example, and there may be other relationships of the light emitting areas.

The structure of the first light emitting unit 202 is not limited hereto, and the structure can be that centers of the three sub-pixels are arranged along the same straight line. The first light emitting unit 202 can also include sub-pixels of other numbers, for example include two, four, or other numbers of sub-pixels, as long as the color display requirement of the display screen is satisfied.

The second light emitting unit 203 includes a first sub-pixel, a second sub-pixel, and a third sub-pixel. The three sub-pixels can emit light of different colors, respectively. Specifically, the sub-pixels can for example emit light of red (R), green (G), and blue (B).

The three sub-pixels of the second light emitting unit 203 are arranged in a triangle, and the structures of the first light emitting unit 202 and the second light emitting unit 203 are mirror symmetrical.

The structure of the second light emitting unit is not limited hereto, and the structure can be that centers of the three sub-pixels are arranged along the same straight line. The second light emitting unit 203 can also include sub-pixels of other numbers, for example include two, four, or other numbers of sub-pixels, as long as the color display requirement of the display screen is satisfied.

In the first direction, i.e., in the lateral direction, the first light emitting units 202 are continuously arranged, and the second light emitting units 203 are also continuously arranged. In the second direction, i.e., in the longitudinal direction, the first light emitting units 202 and the second light emitting units 203 are alternately arranged. At the edge of the display screen, the first light emitting units 202 and the second light emitting unit 203 with different structures are combined with each other and alternately arranged, such that the shape of the contour line 201 of the display screen can be fitted, and the image displayed by the edge is close to the contour line 201 of the shaped screen. When observed at the microscopic scale, the jaggedness can be reduced.

The first light emitting unit 202 herein is different from the first light emitting unit 102 of the above embodiment. The first light emitting unit 202 herein includes three sub-pixels, and the first light emitting unit 102 of the above embodiment includes six sub-pixels.

A display device is provided according to embodiments of the present disclosure. The display device includes the aforementioned display screen, a power module, used to supply power to the display screen; a storage module, used to store media information; and a processing module electrically coupled to the display screen, the power module, and the storage module, and the processing module is used to control the power supplied by the power module, and display the media information on the display screen.

The display screen is an input/output device that displays electronic information on the screen as an image through a transmission device. The display screen can be LCD, CRT, PDP, OLED, or the like. The more colors displayed, the more complex the displayed image is, and the more vivid the picture exhibits.

The power module is a power supply station that can be directly mounted on a printed circuit board, and supplies power to the driving circuit, the information storage module, and the image processing module of the display screen. The power module can also be a power adapter or voltage conversion device that can be connected to the commercial power, so as to convert the commercial power of 220V to an operating voltage of the display screen.

The storage module is used to store or cache driving signals of the sub-pixels. In the computer field, each pixel is represented by 24 bits, and the three primary colors (red, green, and blue) are each divided into 8 bits. The intensity of each primary color is divided into 256 values according to the highest value 28 of 8 bits.

The driving signals of the pixel unit refers to the intensities of the three primary colors. The processing module is electrically coupled to the display screen, the power module, and the storage module. The processing module controls the power supplied by the power module to other modules. After the power module is powered, the processing module processes the image data in real time, generates driving signals according to the image data, inputs the driving signals to the display screen, and controls the sub-pixels of the display screen to emit light. The light emitted by the adjacent sub-pixels mixes and eventually presents an image that is easily recognizable by the human eye.

In the display screen and the display device integrated with the display screen according to the present disclosure, the first light emitting units and the second light emitting units with different structures are combined with each other and filled with the display screen. The different structures may be different in the number of sub-pixels, or may be different in the radius of curvature of the surface where the light emitting units located, or be mirrored structures, or the like. By providing the first light emitting units and the second light emitting units with different structures on the main display area and the edge display area in the active display area, the obvious jaggedness or graininess of the edge display area when observed under the microscopic scale is reduced, such that the display quality of the display screen is improved.

The specific application scenarios of this application are described hereinafter:

For the display screen structure that has been designed, the contour line of the display screen is determined. For a television with a curved screen or a portable terminal device (such as a mobile phone) with a curved screen, in order to realize the function of the display screen, the pixel units need to be arranged. However, considering that the pixel units are physical entities having certain sizes and determined shapes, when the pixel units are arranged along the contour line, since the contour line is usually a smooth curve, the contour line and the pixel units are not completely coincided, such that certain degree of jaggedness is presented. In order to alleviate the jaggedness existing during displaying due to the arrangement of the pixel units to fit the contour line, the following manner can be employed.

In one of the embodiments of the present disclosure, the first light emitting units including six sub-pixels and the second light emitting units including three sub-pixels are employed. Of source, since the first light emitting units include more sub-pixels, a good local whit balance performance is achieved. The second light emitting units including three sub-pixels are arranged between the contour line and the first light emitting units, such that the jaggedness of displaying is reduced.

In the three sub-pixels, the first sub-pixel, the second sub-pixel, and the third sub-pixel may be arranged in a triangle or arranged along a straight line.

In another embodiment of the present disclosure, the first light emitting units use three sub-pixels, and the second light emitting units use three sub-pixels in another type of structure. In the first direction, the first light emitting units are continuously arranged. The second light emitting units are also continuously arranged in the first direction. The first light emitting units and the second light emitting units are alternately arranged along the second direction intersecting the first direction. By this arrangement of the first light emitting units and the second light emitting units, the jaggedness of displaying can also be reduced.

In summary, as approaches for solving the jaggedness during displaying according to the present disclosure, one approach is to combine light emitting units with different sizes, i.e., major area (main display area) of the display screen is formed by light emitting units having relatively greater areas, and in the area (edge display area) incapable of accommodating an entire light emitting unit having relatively greater area, light emitting units having relatively less area are arranged. Another approach is that, at least two types of light emitting units having relatively less areas are formed by different arrangement forms of the sub-pixels, such that the light emitting units having relatively less areas can form an entire light emitting area of the display screen by interleaving arrangement.

Although the present disclosure is illustrated and described herein with reference to specific embodiments, the present disclosure is not intended to be limited to the details shown. It is to be noted that, various modifications may be made in the details within the scope and range of equivalents of the claims and without departing from the present disclosure. Therefore, the protection scope of the present disclosure shall be subject to the protection scope of the claims.

The invention claimed is:

1. A display screen, having an irregular shape and having a contour line defining an active display area, comprising:
   a plurality of repeatedly arranged first light emitting units having a plurality of sub-pixels, each of the plurality of first light emitting units comprising at least one first pixel unit, each first pixel unit comprising a respective red sub-pixel, green sub-pixel, and blue sub-pixel; and
   a plurality of repeatedly arranged second light emitting units having a plurality of sub-pixels, each of the plurality of second light emitting units comprising at least one second pixel unit, each second pixel unit comprising a respective red sub-pixel, green sub-pixel, and blue sub-pixel;
   wherein the number of the sub-pixels in the first light emitting units is greater than the number of the sub-pixels in the second light emitting units.

2. The display screen according to claim 1, wherein the first light emitting units are continuously arranged and form a main display area in the active display area, and at least one second light emitting unit is independently distributed and forms an edge display area in the active display area.

3. The display screen according to claim 2, wherein a normal distance from a center of the second light emitting unit to the contour line does not exceed a preset distance threshold.

4. The display screen according to claim 1, wherein the first light emitting unit comprises two first sub-pixels, two second sub-pixels, and two third sub-pixels.

5. The display screen according to claim 1, wherein the second light emitting unit comprises a first sub-pixel, a second sub-pixel, and a third sub-pixel.

6. The display screen according to claim 5, wherein the first sub-pixel, the second sub-pixel, and the third sub-pixel in the second light emitting unit are arranged in a triangle or arranged along a straight line.

7. The display screen according to claim 6, wherein the triangle is an acute triangle or a right triangle.

8. The display screen according to claim 4, wherein a light emitting area of one of the first sub-pixel, the second sub-pixel, and the third sub-pixel is different from light emitting areas of the other two sub-pixels.

9. The display screen according to claim 1, wherein the second light emitting unit comprises one of the following:
   two first sub-pixels, two second sub-pixels, and a third sub-pixel;
   two first sub-pixels, a second sub-pixel, and a third sub-pixel;
   two sub-pixels from a first sub-pixel, a second sub-pixel, and a third sub-pixel; and
   one sub-pixel from a first sub-pixel, a second sub-pixel, and a third sub-pixel.

10. The display screen according to claim 1, wherein the first light emitting unit comprises one of the following:
- two first sub-pixels, two second sub-pixels, and a third sub-pixel;
- two first sub-pixels, a second sub-pixel, and a third sub-pixel; and
- a first sub-pixel, a second sub-pixel, and a third sub-pixel.

11. The display screen according to claim 1, wherein when the number of the sub-pixels in the first light emitting units is equal to the number of the sub-pixels in the second light emitting units, the first light emitting units and the second light emitting units are continuously arranged along a first direction, respectively, and the first light emitting units and the second light emitting units are alternately arranged along a second direction intersecting the first direction.

12. The display screen according to claim 11, wherein an arrangement pattern of the sub-pixels in the second light emitting units and an arrangement pattern of the sub-pixels in the first light emitting units are mirror symmetrical in the first direction.

13. The display screen according to claim 1, wherein a radius of curvature of a surface where the first light emitting units are located is greater than a radius of curvature of a surface where the second light emitting units are located.

14. The display screen according to claim 1, wherein at an edge of the display screen, the first light emitting units and the second light emitting unit with different structures are combined with each other and alternately arranged, such that a shape of a contour line of the display screen having the irregular shape are fitted;
wherein an arrangement pattern of the sub-pixels in the second light emitting units and an arrangement pattern of the sub-pixels in the first light emitting units are mirror symmetrical at the edge of the display screen.

15. The display screen according to claim 1, wherein the number of the sub-pixels in the second light emitting units is reduced corresponding to a reduction of the number of the sub-pixels in the first light emitting units.

16. The display screen according to claim 1, wherein:
the color displayed by the first light emitting unit is associated with the types of sub-pixels of the first light emitting unit; and
the color displayed by the second light emitting unit is associated with the types of sub-pixels of the second light emitting unit.

17. A display screen, having an irregular shape and having at least a first curved contour line and a second curved contour line defining an active display area, and comprising a plurality of repeatedly arranged first light emitting units and a plurality of repeatedly arranged second light emitting units;
wherein a radius of curvature of the first curved contour line is greater than a radius of curvature of the second curved contour line, wherein the plurality of first light emitting units are located along a first edge of a surface defined by the first curved contour line, and wherein the plurality of second light emitting units are located along a second edge of the surface defined by the second curved contour line.

18. The display screen according to claim 17, wherein the first light emitting units are continuously arranged and form a main display area in the active display area, and at least one second light emitting unit is independently distributed and forms an edge display area in the active display area.

19. A display device, comprising:
a display screen, having an irregular shape and having a surface, with at least a first curved contour line and a second curved contour line, defining an active display area, and comprising a plurality of repeatedly arranged first light emitting units and a plurality of repeatedly arranged second light emitting units,
wherein each of the plurality of first light emitting units further comprises at least one first pixel unit, each first pixel unit comprising a respective red sub-pixel, green sub-pixel, and blue sub-pixel,
wherein each of the plurality of second light emitting units further comprises at least one second pixel unit, each second pixel unit comprising a respective red sub-pixel, green sub-pixel, and blue sub-pixel,
wherein the number of sub-pixels in the first light emitting units is greater than or equal to the number of sub-pixels in the second light emitting units, and wherein a radius of curvature of the first contour line is greater than a radius of curvature of the second curved contour line, wherein the plurality of first light emitting units are located along a first edge of a surface defined by the first curved contour line, and wherein the plurality of second light emitting units are located along a second edge of the surface defined by the second curved contour line;
a power module supplying power to the display screen;
a storage module storing media information; and
a processing module electrically coupled to the display screen, the power module, and the storage module, the processing module controlling the power supplied by the power module, and displaying the media information on the display screen.

20. The display device according to claim 19, wherein when the number of the sub-pixels in the first light emitting units is equal to the number of the sub-pixels in the second light emitting units, the first light emitting units and the second light emitting units are continuously arranged along a first direction, respectively, and the first light emitting units and the second light emitting units are alternately arranged along a second direction intersecting the first direction.

* * * * *